United States Patent
Yang et al.

[11] Patent Number: 6,121,155
[45] Date of Patent: Sep. 19, 2000

[54] INTEGRATED CIRCUIT FABRICATION CRITICAL DIMENSION CONTROL USING SELF-LIMITING RESIST ETCH

[75] Inventors: Chih-Yuh Yang; Scott Bell, both of San Jose; Qi Xiang, Santa Clara, all of Calif.

[73] Assignee: Advanced Micro Devices, Sunnyvale, Calif.

[21] Appl. No.: 09/205,590

[22] Filed: Dec. 4, 1998

[51] Int. Cl.[7] .................................................. H01L 21/302
[52] U.S. Cl. .................. 438/725; 430/5; 216/48; 216/67
[58] Field of Search .................... 430/5; 216/48, 216/67; 438/725

[56] References Cited

U.S. PATENT DOCUMENTS

| 3,997,367 | 12/1976 | Yau | 148/1.5 |
| 5,804,088 | 9/1998 | McKee | 216/47 |

FOREIGN PATENT DOCUMENTS

| 753885 | 1/1997 | European Pat. Off. . |
| 2-002563 | 1/1990 | Japan . |
| 5-267155 | 10/1993 | Japan . |
| 8-288257 | 11/1996 | Japan . |

OTHER PUBLICATIONS

"Trimming of Negative Electron Resist for Multilevel Metallization"; Hieke et. al; 10–82'; Microcircuit Engineering 82', abstract only.

*Primary Examiner*—William Powell
*Assistant Examiner*—George Goudreau
*Attorney, Agent, or Firm*—Eugene H. Valet

[57] ABSTRACT

The present invention provides a process for self-limiting trim etch of patterned photoresist that will allow integrated circuit fabrication to achieve smaller integrated circuit component features and greatly reduce final critical dimension drift or variation. Trim time is set in a plateau region of the critical dimension loss process curve.

5 Claims, 7 Drawing Sheets

INTEGRATED CIRCUIT FABRICATION CRITICAL DIMENSION CONTROL USING SELF-LIMITING RESIST ETCH

BACKGROUND OF THE INVENTION

1. Field of the Invention

The present invention relates generally to integrated circuit technology, more specifically to integrated circuit fabrication processes and, in particular, to an etch process and product which have improved critical dimension control.

2. Description of Related Art

In order to fabricate the complex, three-dimensional structure of an integrated circuit, the execution of a relatively large number of individual and complex interactive operations is required. It is well known to use photolithographic techniques in order to achieve the very small dimensions of the individual components, namely, the millions of transistors, interconnects, and the like, that make up one integrated circuit (commonly and hereinafter also referred to as a "die" or a "chip)" which itself is perhaps only 5-millimeters per side. Fundamentally, photolithography is used in performing masking processes that allow etching and ionic implanting manipulations of selected regions of a semiconductor substrate. The photolithographic process for a single wafer of chips requires repeated transfers of images via the use of a set of photosensitive masks (known as and hereinafter also referred to as "photoresist" or simply "resist") to a semiconductor wafer.

There is an ever constant demand for more powerful integrated circuits, meaning more circuit components within the same size or smaller chip. Very large scale integration ("VLSI") in integrated circuit technology has resulted in chips in which the geometry of individual components is continuously scaled downward in order to provide more complex integrated circuits, to improve performance, and to conserve chip area for better manufacturing yield, using substantially the same die sizes. Integrated circuit fabrication process specific design rules are commonly referred to in terms relating to aspects of the dimensions of certain regions of a particular circuit. A popular measure is "channel length" or "gate length" of a field effect transistor, e.g., a "0.5-micron process." A specific set of design rules for a specific generation of VLSI is also referred to hereinafter more simply as a "process generation."

A problem with current photolithographic techniques is that there appears to be a limit to the size component feature that can be achieved. For example, using deep ultraviolet photolithography, the smallest feature that theoretically can be fabricated in the state-of-the-art is about 0.2-micron, or 200-nanometers ("nm"). Primary problems in achieving greater resolution with current optical imaging equipment appear to be due to the formation of standing wave patterns generated in the photoresist, the change in focus of projected images, and light scattering and lateral exposure that causes changes in the width of individual regions of the structure. All of these factors can result in individual component alignment errors.

In order to achieve a smaller feature, for example a CMOS field-effect transistor ("FET") transistor having a gate length of 0.15-micron or less, there is a need for new technology to go beyond photolithography capabilities for miniaturization.

SUMMARY OF THE INVENTION

In a basic aspect, the present invention provides an integrated circuit fabrication critical dimension control process including the steps of: depositing at least one layer of masking material; forming a mask of said at least one layer of masking material; etching said mask in a high density plasma with a masking material etch such that a critical dimension loss saturation point is reached and said step of etching enters a substantially constant saturation period limiting further critical dimension loss of said mask.

In another basic aspect, the present invention provides a high density plasma etch method for trimming photoresist to sub-photolithographic critical loss dimensions, including the steps of: establishing an HBr gas flow rate in a plasma chamber of the system in a range of approximately 50-sccm to 100 sccm, establishing an $O_2$ flow rate in the plasma system chamber in a range of approximately 5-sccm to 15-sccm, providing a plasma chamber temperature in a range in the plasma system chamber of approximately 50° to 75° C., providing pressure in the plasma system chamber in a range of approximately three-milliTorr to ten-milliTorr, operating plasma generating source power in a range of approximately 500-Watts to 1000-Watts, and operating wafer bias power in a range of approximately 25-Watts to 125-Watts, such that trim etching achieves a substantially constant plateau.

In yet another basic aspect, the present invention provides an integrated circuit formed in accordance with a process. Following patterning of photoresist mask features, the mask features trimmed using high density plasma etch method including the steps of: a) establishing an HBr gas flow rate in a plasma chamber of the system in a range of approximately 50-sccm to 100- sccm, b) establishing an $O_2$ flow rate in the plasma system chamber in a range of approximately 5-sccm to 15-sccm, c) providing a plasma chamber temperature in a range in the plasma system chamber of approximately 50° to 75° C., d) providing pressure in the plasma system chamber in a range of approximately three-milliTorr to ten-milliTorr, e) operating plasma generating source power in a range of approximately 500-Watts to 1000-Watts, and f) operating wafer bias power in a range of approximately 25-Watts to 125-Watts, wherein such steps achieve component features smaller than known manner photolithographic printing methods.

In yet a further basic aspect, the present invention provides an integrated circuit FET device having gate lengths formed by a self-limiting resist trim using a high density plasma etch mechanism for trimming resist such that said gate lengths are of a dimension less than that formed with known manner lithographic integrated circuit fabrication processes.

It is an advantage of the present invention that it improves integrated circuit component feature critical dimension control.

It is an advantage of the present invention that it improves manufacturability of integrated circuits.

It is an advantage of the present invention that it can be used to achieve integrated circuit feature dimensions smaller than state-of-the-art photolithography processes.

It is an advantage of the present invention that it improves reproducibility of final inspect process stage critical dimension control.

It is a further advantage of the present invention that it is a self-limiting process.

It is a further advantage of the present invention that it has a relatively wide process window.

It is a further advantage of the present invention that it improves die yield.

Other objects, features and advantages of the present invention will become apparent upon consideration of the following explanation and the accompanying drawings, in which like reference designations represent like features throughout the drawings.

BRIEF DESCRIPTION OF THE DRAWINGS

FIGS. 1 through 16 demonstrate the sequential fabrication of an exemplary integrated circuit device in accordance with the present invention in which:

FIG. 1 depicts semiconductor starting material,

FIG. 2 depicts shallow trench isolation etch,

FIG. 3 depicts trench insolation oxide fill and planarization polish,

FIG. 4 depicts n-channel ion implantation,

FIG. 5 depicts p-channel ion implantation,

FIG. 6 depicts gate oxide growth, polysilicon deposition, oxynitride deposition, and spin-on photoresist, FIG. 7 depicts photolithography gate masking, FIG. 8 depicts photoresist trim etch, FIG. 9 depicts oxynitride etch and polysilicon gate etch, FIG. 10 depicts photoresist and oxynitride strip, FIG. 11 depicts n-channel source/drain extension implant, FIG. 12 depicts p-channel source/drain extension implant, FIG. 13 depicts gate sidewall spacer formation, FIG. 14 depicts n-channel source/drain implant, FIG. 15 depicts p-channel source/drain implant, and FIG. 16 depicts self-aligned silicide formation.

The drawings referred to in this specification should be understood as not being drawn to scale except if specifically noted.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable. It should be recognized that many publications describe the details of common techniques used in the fabrication process of integrated circuit components. See, e.g., Wolf, S., *Silicon Processing for the VLSI Era*, copyright 1990, Lattice Press; Sze, S. M., *VLSI Technology*, copyright 1988, McGraw-Hill; Ghandhi, S. K., *VLSI Fabrication Principles*, copyright 1983, John Wiley & Sons; or *Semiconductor & Integrated Circuit Fabrication Techniques*, Reston Publishing Co., Inc., copyright 1979 by the Fairchild Corporation. Those known manner techniques are generally employed in the fabrication of the structure of the present invention except in the steps required to accomplish the goals of the present invention; as such, an in depth description of known manner steps is unnecessary to an understanding of the present invention. Moreover, the individual steps of such a process can be performed using commercially available integrated circuit fabrication machines. See, e.g., Chapman, B., *Glow Discharge Processes/Sputtering and Plasma Etching*, copyright 1980, John Wiley & Sons. As specifically helpful to an understanding of the present invention, approximate technical data are set forth based upon current technology. Future developments in this art may call for appropriate adjustments as would be obvious to one skilled in the art.

It will be intuitively obvious to a person skilled in the art that the invention taught herein will have wide applicability to integrated circuit fabrication processes; this description relies on an exemplary implementation of industrial applicability and no limitation on the scope of the invention is intended nor should any be implied therefrom.

The present invention will be described in terms of building a CMOS FET construct have an n-channel device and a p-channel device. A FET consists of two closely spaced, doped regions (the "source" and "drain") in a substrate. The region of substrate between the source and drain is the "channel." A thin insulation layer is formed directly above the channel. A conductive material "gate" electrode is positioned directly over and covering the insulation layer superjacent the channel. A voltage applied to the gate affects the electronic properties of the subjacent channel, turning the FET ON (conducting) or OFF (non-conducting).

Figure 1:
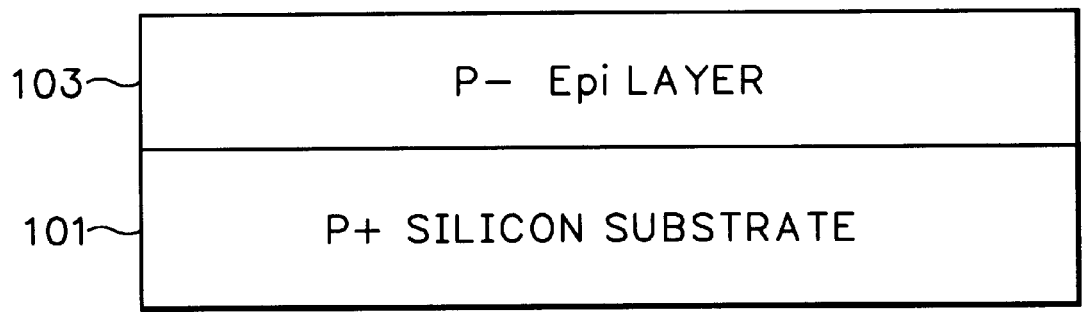

As shown in FIG. 1, the foundational material for integrated circuit fabrication consists of a commercial silicon substrate 101, doped with a relatively high p-type ion concentration, P+ ($10^{18}$/cm$^3$). An epitaxial layer 103 consists of silicon having a lighter doping p-type ion concentration, P− ($10^{16}$/cm$^3$).

Figure 2:
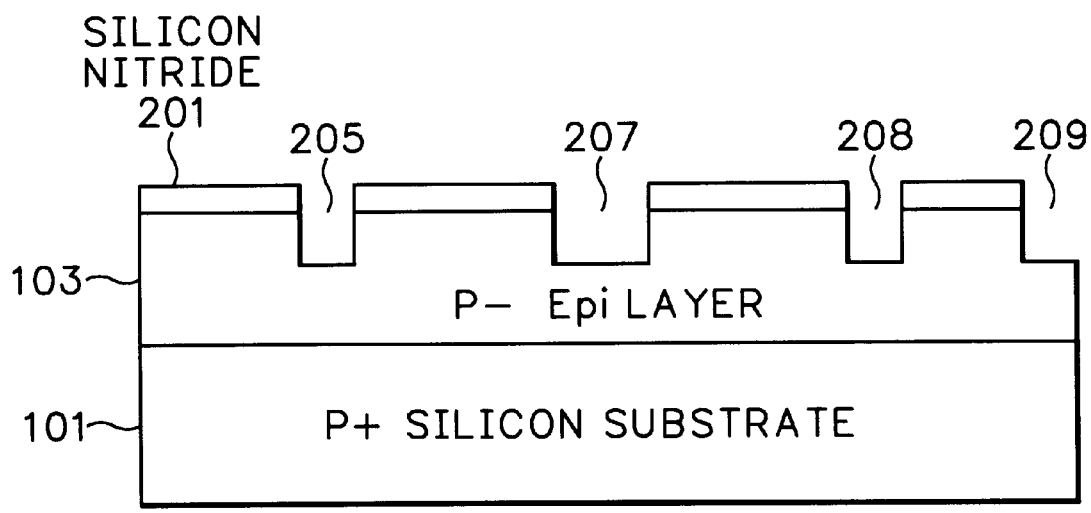
Figure 3:
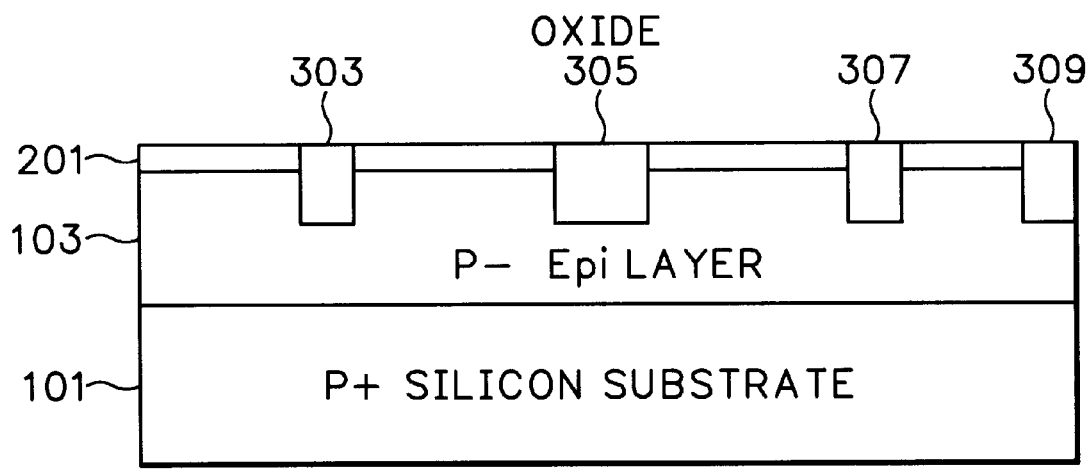

As depicted in FIG. 2, using a silicon nitride mask 201, trenches 203, 205, 207, 209 et seq., are formed in the epitaxial layer 103. The trenches 203, 205, 207, 209 et seq., are filled with oxide 303, 305,307, 309 et seq., respectively, as shown in FIG. 3. The filled trenches will provide p-type device/n-type device oxide regions known in the art as "shallow trench isolation" ("STI") regions. [See, e.g., U.S. Pat. No. 5,759,871 (Hause et al.) and U.S. Pat. No. 5,767,000 (Fulford, Jr. et al.) assigned to the common assignee of the present. Local oxidation of silicon, known as the "LOCOS," to form device FOX isolation, and the like processes are also compatible with the present invention.] The surface is planarized via a known manner polishing process and the silicon nitride mask 201 is stripped.

Figure 4:
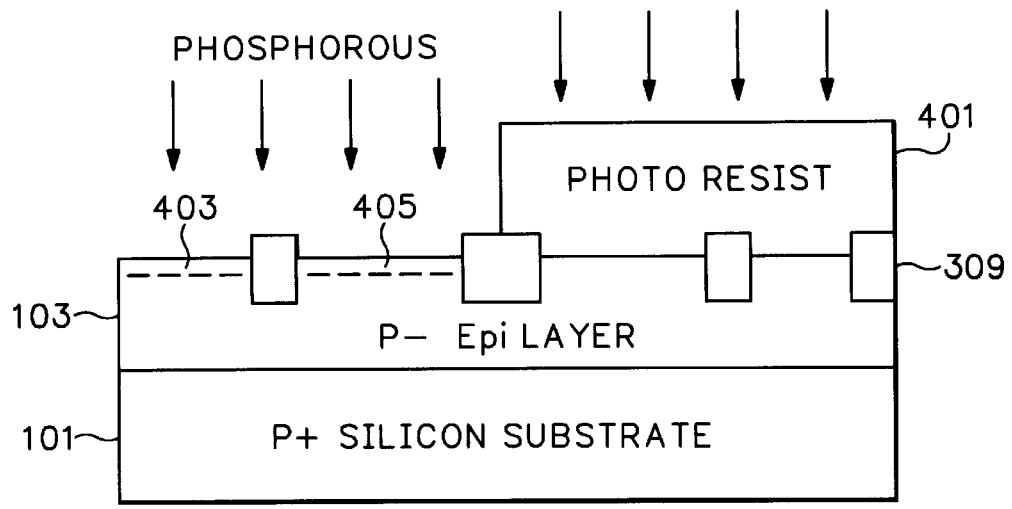
Figure 5:
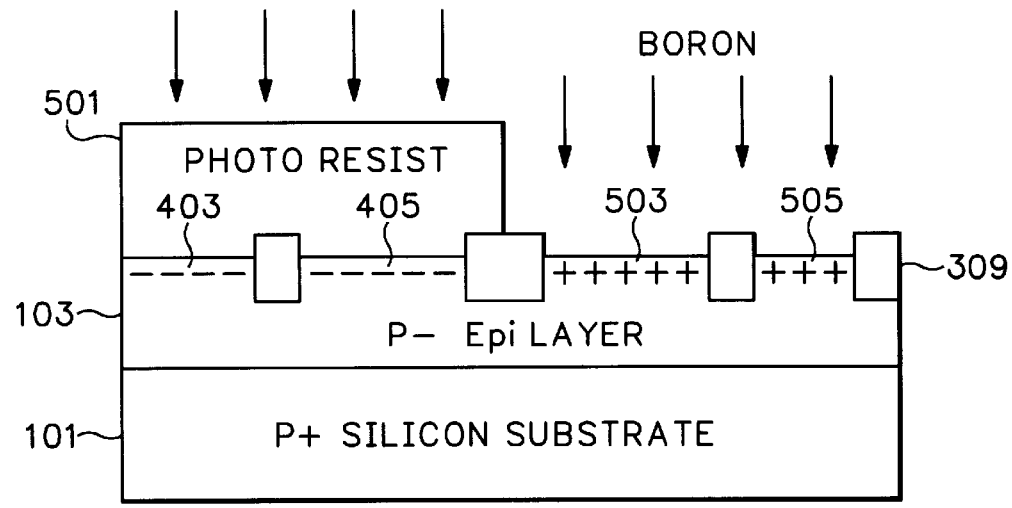

As shown in FIG. 4, a photoresist mask 401 is formed to shield p-channel device regions of the epitaxial layer 103. Ion implantation of phosphorous forms FET channel implant regions 403, 405 of n-type doping of the epitaxial layer 103. Similarly, as shown in FIG. 5, a photoresist mask 501 is formed to shield n-channel device regions of the epitaxial layer 103 and ion implantation of boron forms FET channel implant regions 503, 505 of p-type doping.

Figure 6:
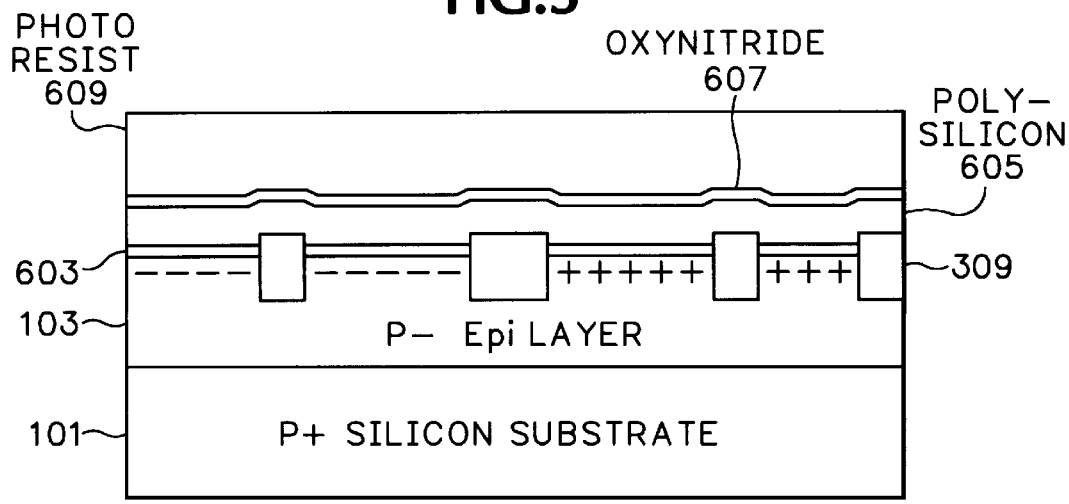

At this stage it is appropriate to form the FET gates. Turning to FIG. 6, after the photoresist mask 501 has been stripped, a gate oxide layer 603, having a thickness in the range of approximately fifteen Angstroms to forty Angstroms (again, depending on the process generation) is formed on the epitaxial layer 103. Next, a layer of polysilicon, or amorphous silicon, 605, having a thickness of approximately fifteen hundred Angstroms to twenty five hundred Angstroms, is formed over the gate oxide layer 603. A bottom antireflective coating ("BARC"), e.g., silicon-oxynitride, layer 607, having a thickness of approximately two hundred Angstroms to four hundred Angstroms is deposited upon the polysilicon 605. This prevents stray light from affecting feature formation during photolithographic steps of the process, improving resist patterning capabilities and critical dimension control. Photoresist 609, to be formed into masks, is spun on, having a process generation range of approximately five thousand Angstroms to seven thousand Angstroms.

Figure 7:
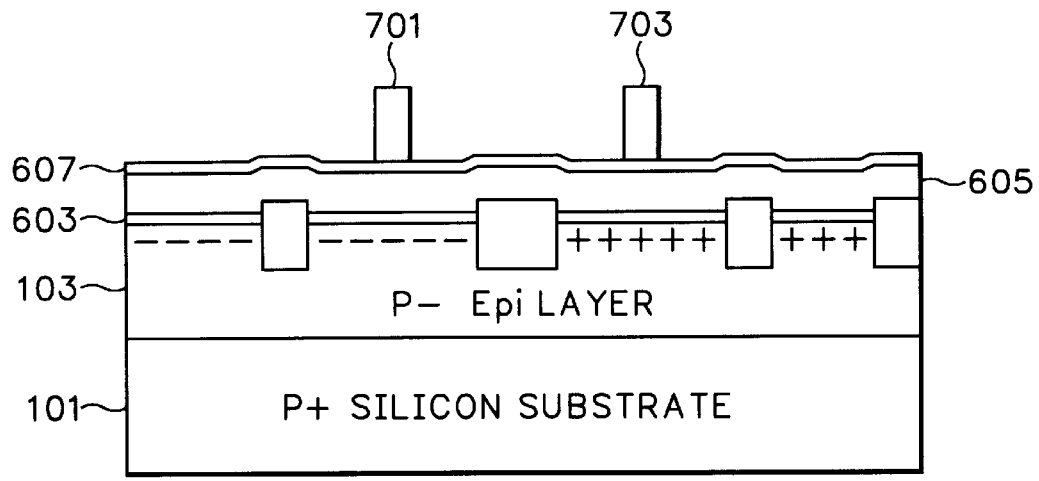

As depicted in FIG. 7, photoresist pillars 701, 703 are then patterned using conventional photolithographic techniques and conventional trim plasma etching.

Figure 17:
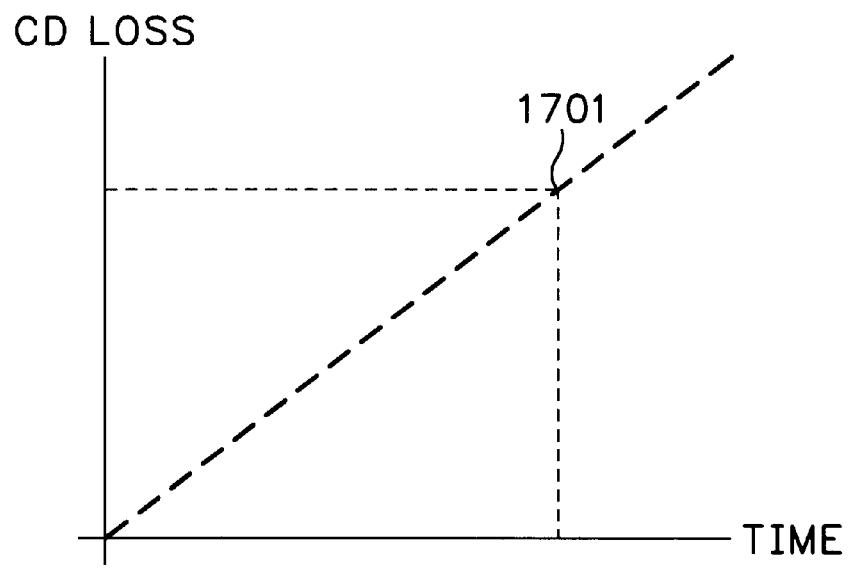
FIG. 17 (Prior Art) is a graph depicting a typical plasma etch process critical dimension bias plot.

Turning to FIG. 17, conventional plasma etch processes have a plot which is generally not controlled; that is, with increasing time, the etch process continues with a substantially linear critical dimension loss of the photoresist. Thus, using conventional wisdom, the plasma etch process is stopped when gate length critical dimension loss of the photoresist, directly proportional to the target gate length, is achieved. Missing the exemplary critical stop point 1701 on either side of the curve results in potential die yield loss since the wafer may contain features which are out of tolerance. Moreover, as noted above in the Background section, this type of trim etch is also insufficient to achieve desired sub-lithographic printing technique feature lengths.

Figure 18:
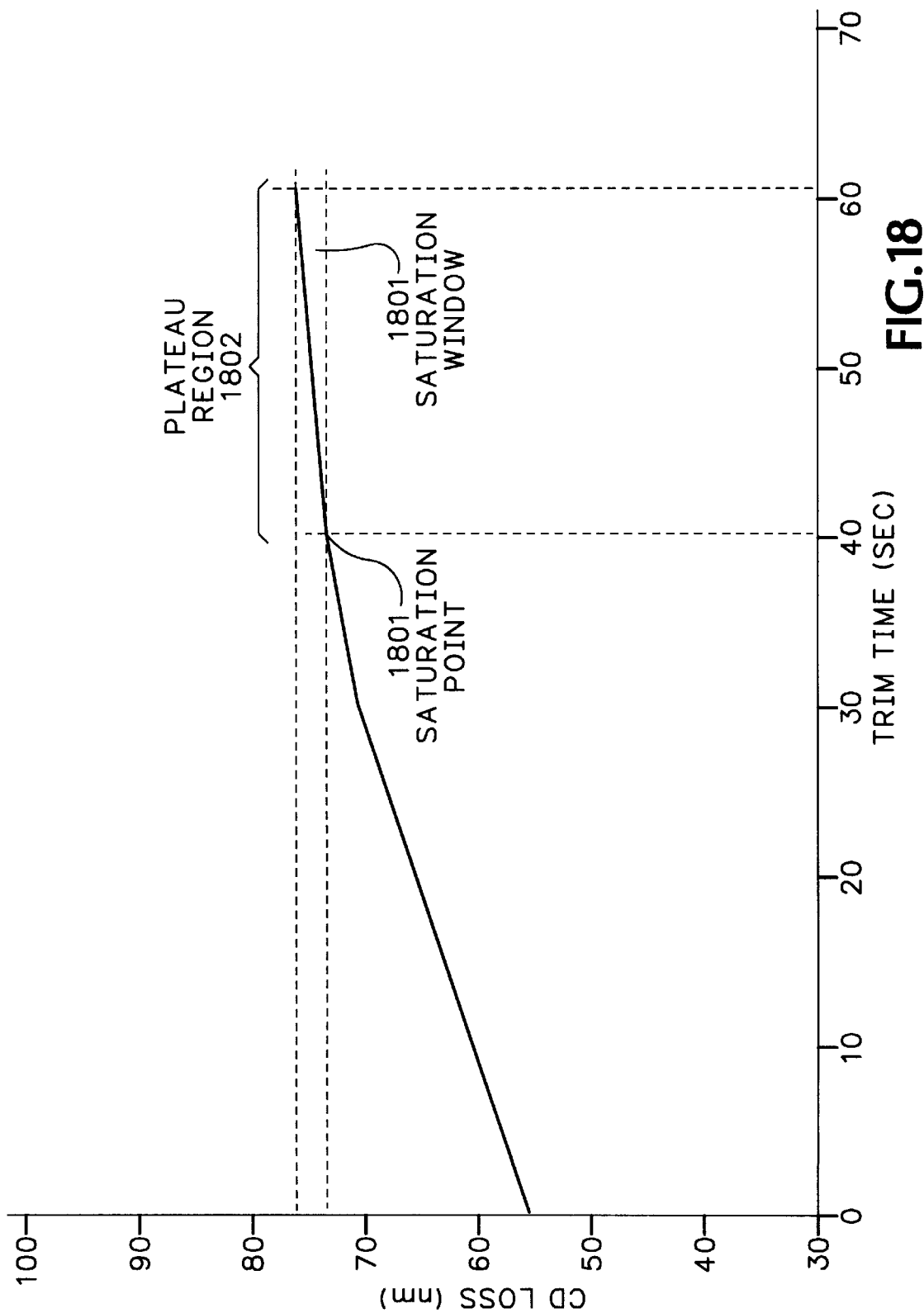
FIG. 18 is a graph depicting a critical dimension bias curve in accordance with the present invention.

Now then, in order to achieve a smaller feature than achieved with known manner lithographic processes, a self-limiting resist trim etch step is performed in accordance with the present invention. Using a plasma etch process in a conventional high density plasma system, a resist trim saturation is achieved by creating a polymer passivation. The saturation point ends the linear critical dimension loss as shown in FIG. 17 and creates a critical dimension loss saturation plateau as shown in FIG. 18. In other words, no substantial critical dimension loss occurs after Saturation Point 1801 in FIG. 18 even though resist etch Trim Time (sec) increases. This Plateau Region 1802 has been found to be sustained for a relatively long period. In some implementations however, there may be a critical dimension gain (the critical dimension bias curve would begin to drop) due to a relatively heavy polymer buildup if trim time is extended. Still, a wide process margin with a fixed critical dimension bias can be achieved in a relatively long Plateau Region 1802, providing a Saturation Window 1803 in which the critical dimension loss is relatively stable and within design rules for feature size and alignment.

In the preferred embodiment plasma trim etch, control of conditions is improved in the process to achieve self-limiting by using $HBr/O_2$ plasma discharge etch. An HBr gas flow rate in the range of fifty-to-one-hundred standard cubic centimeter/minute ("sccm") is established in the plasma reactor chamber. An $O_2$ flow rate of five-sccm to fifteen-sccm is established. Argon, an inert gas, is introduced at a flow rate of zero-sccm to ten-sccm. Operating pressure is approximately three-milliTorr to ten-milliTorr. Plasma generating source power is approximately five hundred Watts to one thousand Watts. Wafer bias power is in the range of approximately twenty-five Watts to one-hundred-twenty-five Watts. The temperature range is in the range of approximately 50° to 75° C. Trim time to achieve the Plateau Region will vary with the exact chemistry involved.

Figure 8:
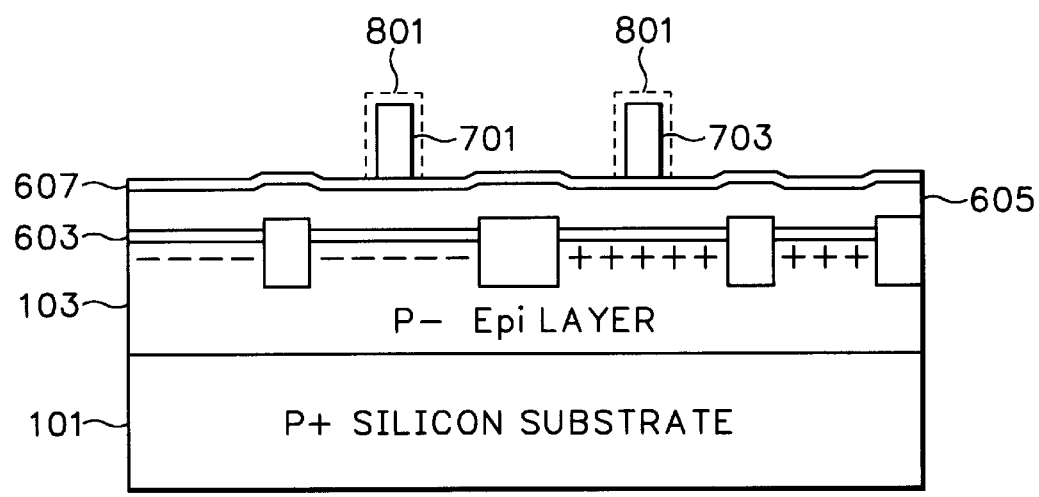

The shrinkage result—referred to as Develop/Inspect Critical Dimension, "DICD," point, the critical dimension after lithography and before trim etch—is depicted in FIG. 8, where the dotted line 801 represents the preshrinkage dimensions of the pillars 701, 703. In both width and height, the self-limiting photoresist trim etch process just described is used to produce a gate feature that will be smaller than that achieved using prior art techniques.

Figure 9:
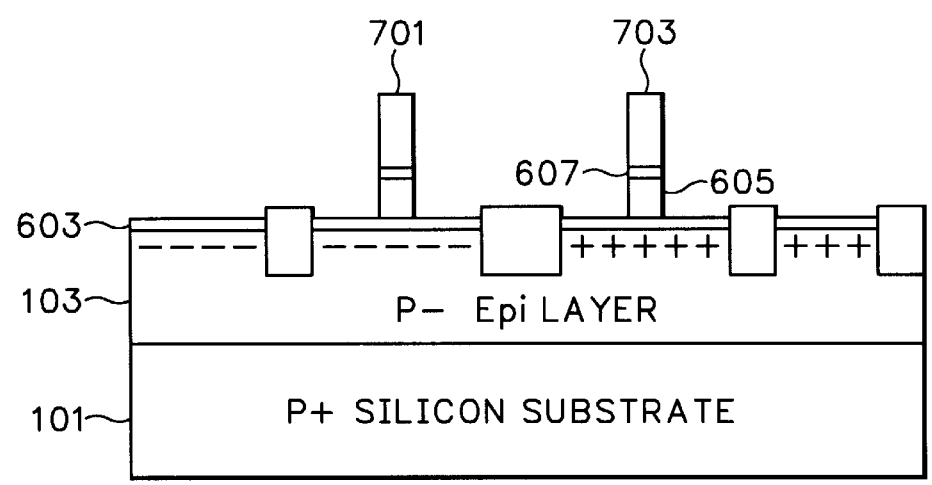

Turning to FIG. 9, a known manner oxynitride 607 and polysilicon 605 etch will follow the now smaller photoresist width dimension. Note that using these conventional etch techniques, some further CD LOSS can be expected, such that a Final Inspect Critical Dimension, "FICD," point is slightly less than DICD. A different critical dimension target can be achieved by altering DICD without disturbing the etch process in accordance with the present invention. This will greatly reduce FICD drift or variation when trim time is set up in the Plateau Region, enabling reproducible control of FICD with variation well within the design rules.

Figure 10:
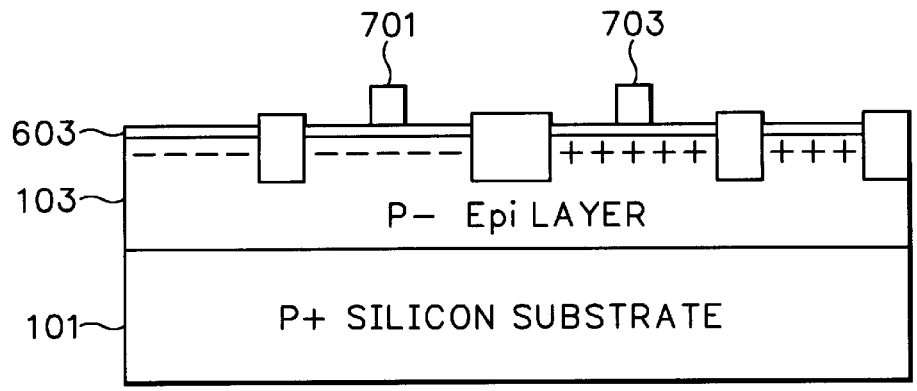
Figure 11:
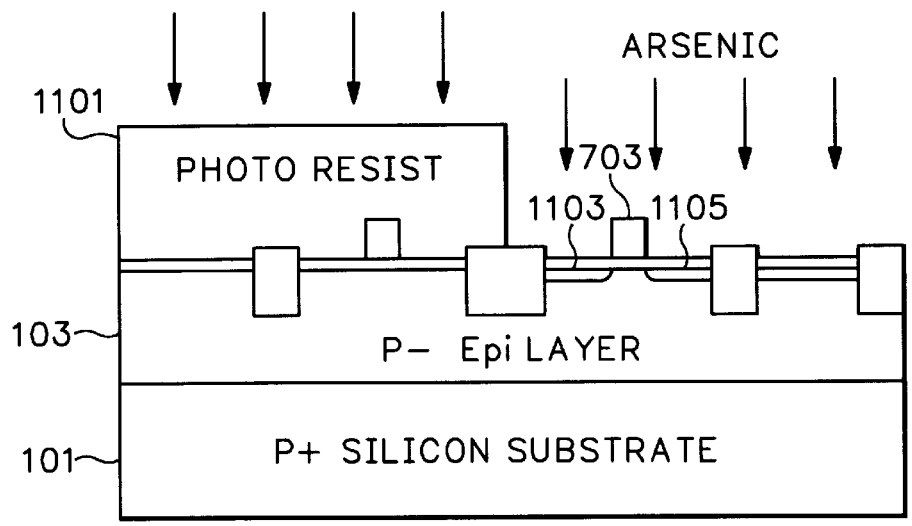
Figure 12:
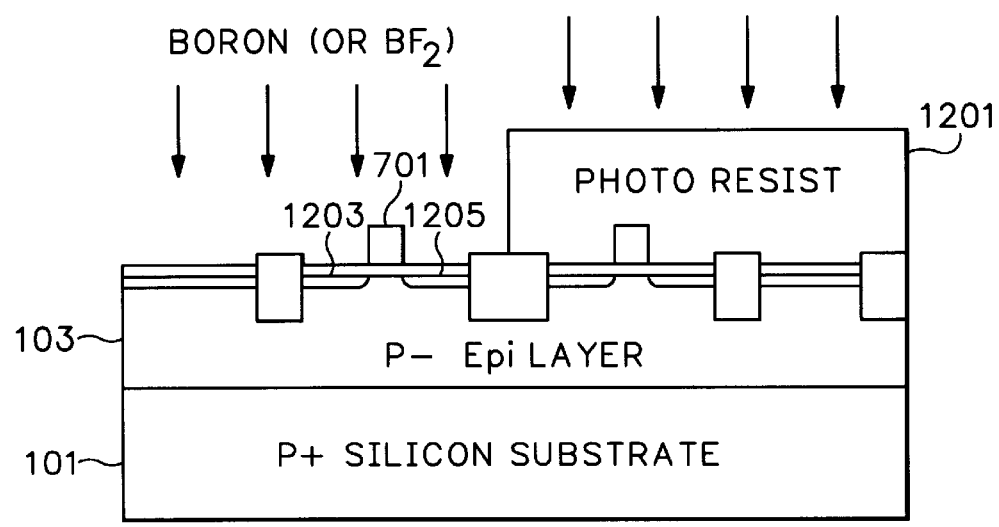

As shown in FIG. 10, a strip of the photoresist 609 and the oxynitride 607 from the pillars 701, 703 leaves the polysilicon material pillars and subjacent gate oxide 603 to act as a self-aligned mask for further known manner ion implants as shown in FIGS. 11 and 12 in order to form the n-channel source and drain extensions and the p-channel source and drain extensions, respectively. FIG. 11 demonstrates the implantation via another photoresist mask 1101, allowing arsenic ions to extend the n-channel source drain regions 1103, 1105; the p-channel device region being shielded by the mask 1101. The mask 1101 is stripped and, similarly to FIG. 11, a new mask 1201 for extending p-channel source and drain regions 1203, 1205 by ion implantation is used as depicted in FIG. 12.

Figure 13:
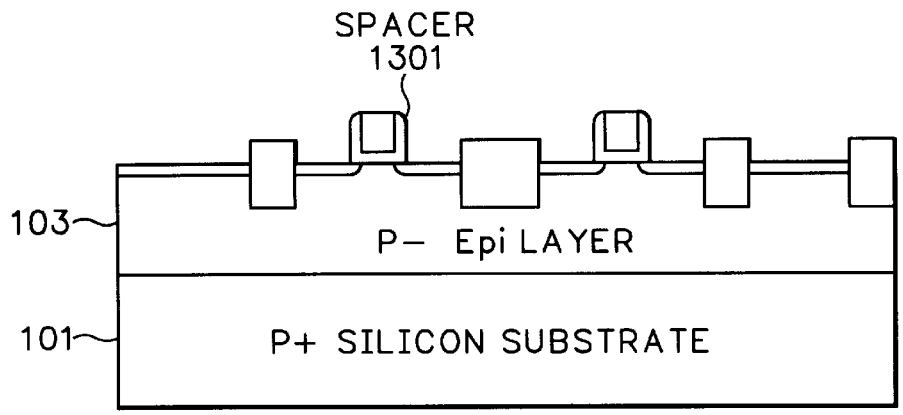

In FIG. 13, gate sidewall spacers 1301 are formed by a conformal dielectric film deposition (such as $Sio_2$ or SiN) followed by an anisotropic etch (i.e., RIE). The spacers 1301 perform the function of masking subjacent regions for final source and drain doping implants.

Figure 14:
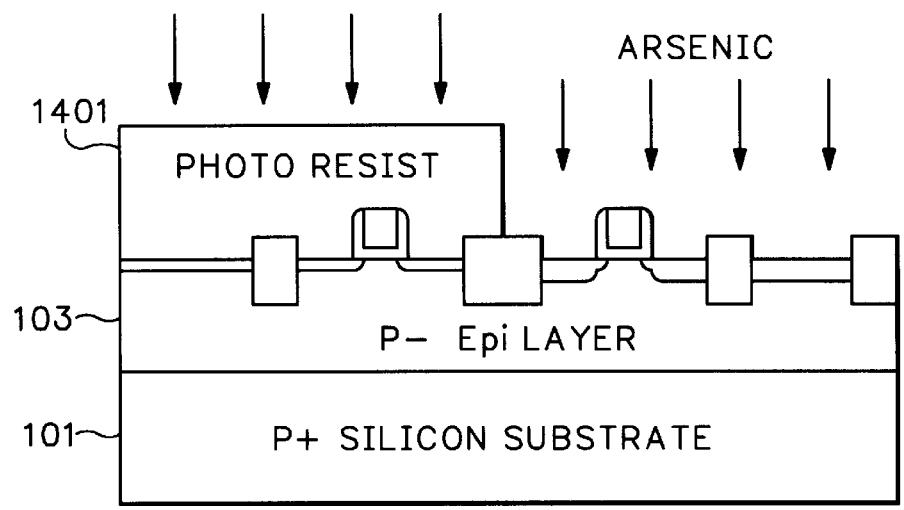
Figure 15:
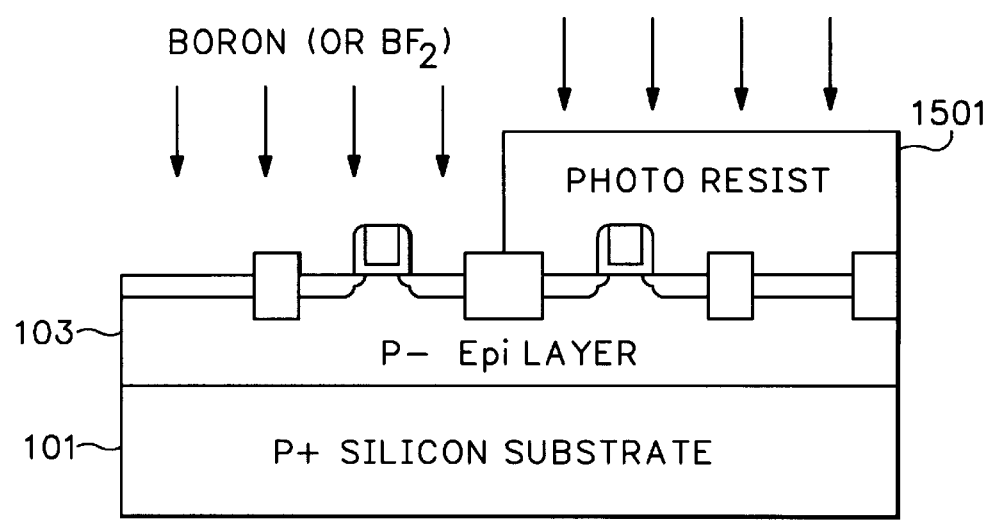

As shown in FIGS. 14 and 15, using known manner photoresist 1401, 1501 masking and ion implanting techniques, the n-channel source and drain implants and p-channel source and drain implants are performed, respectively.

Figure 16:
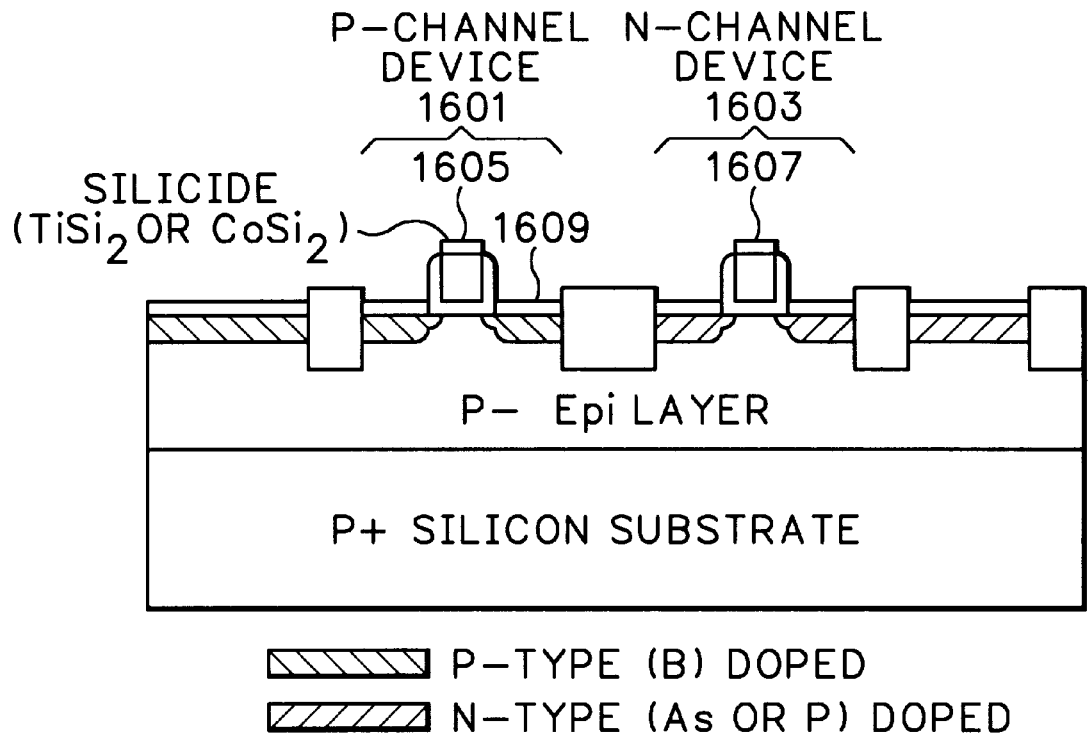

Turning finally to the CMOS device fabrication depiction of FIG. 16, with all photoresist stripped, a silicide on the gates 1605, 1607, respectively, and source/drain 1609 are formed by a known manner self-aligned silicide (SALICIDE) technique.

Thus, the present invention provides a process for self-limiting trim etch of patterned photoresist that will greatly reduce final critical dimension drift or variation. Trim time is set in a plateau region of the critical dimension loss process curve.

The foregoing description of the preferred embodiment of the present invention has been presented for purposes of illustration and description. It is not intended to be exhaustive or to limit the invention to the precise form or, particularly, to exemplary fabrication embodiment disclosed as the process is applicable to a variety of integrated circuit device constructs where CD loss is controlled. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode able others skilled in the art to understand the invention for various embodiments and with various modifications as are suited to the particular use or implementation contemplated. It is intended that the scope of the invention be defined by the claims appended hereto and their equivalents.

What is claimed is:

1. An integrated circuit fabrication critical dimension control process comprising the steps of:

depositing at least one layer of masking material;

forming a mask of said at least one layer of masking material;

etching said mask in a high density plasma with a masking material etch such that a critical dimension loss saturation point is reached and said step of etching enters a substantially constant saturation period limiting further critical dimension loss of said mask.

2. The process as set forth in claim 1, said step of etching comprising the steps of:

establishing an HBr gas flow rate in a plasma chamber of the system in a range of approximately 50 sccm to 100 sccm, establishing an $O_2$ flow rate in the plasma system chamber in a range of approximately 5 sccm to 15 sccm, providing a plasma chamber temperature in a range in the plasma system chamber of approximately 50° to 75° C., providing pressure in the plasma system chamber in a range of approximately three milliTorr to ten milliTorr, operating plasma generating source power in a range of approximately 500 Watts to 1000 Watts, and operating wafer bias power in a range of approximately 25 Watts to 125 Watts.

3. The process as set forth in claim 2, comprising the further step of:

establishing an argon gas flow in the plasma system chamber at a rate of up to 10 sccm.

4. High density plasma etch control method for trimming photoresist to sub-photolithographic critical loss dimensions, comprising the steps of:

establishing an HBr gas flow rate in a plasma chamber of the system in a range of approximately 50 sccm to 100 sccm, establishing an $O_2$ flow rate in the plasma system chamber in a range of approximately 5 sccm to 15 sccm, providing a plasma chamber temperature in a range in the plasma system chamber of approximately 50° to 75° C., providing pressure in the plasma system chamber in a range of approximately three milliTorr to ten milliTorr, operating plasma generating source power in a range of approximately 500 Watts to 1000 Watts, and operating wafer bias power in a range of approximately 25 Watts to 125 Watts, such that trim etching achieves a substantially constant plateau.

5. The method as set forth in claim 4, comprising the further step of:

establishing an argon gas flow in the plasma system chamber at a rate up to 10 sccm.

* * * * *